(12) United States Patent
Song et al.

(10) Patent No.: US 8,465,798 B2
(45) Date of Patent: Jun. 18, 2013

(54) METHOD FOR MANUFACTURING PHOSPHOR AND LIGHT EMITTING DEVICE COMPRISING THE PHOSPHOR

(75) Inventors: Yun Soo Song, Seoul (KR); Sang Hyuk Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 82 days.

(21) Appl. No.: 12/949,879

(22) Filed: Nov. 19, 2010

(65) Prior Publication Data

US 2011/0133630 A1 Jun. 9, 2011

(30) Foreign Application Priority Data

Dec. 4, 2009 (KR) ........................ 10-2009-0120181

(51) Int. Cl.
*B05D 7/00* (2006.01)
(52) U.S. Cl.
USPC ............ 427/219; 427/212; 427/218; 427/180
(58) Field of Classification Search
None
See application file for complete search history.

(56) References Cited

U.S. PATENT DOCUMENTS

| | | | |
|---|---|---|---|
| 4,208,448 A * | 6/1980 | Panaccione ..................... 427/67 |
| 2001/0048966 A1 | 12/2001 | Tumble et al. |
| 2004/0166318 A1* | 8/2004 | Park et al. ..................... 428/403 |
| 2006/0071591 A1* | 4/2006 | Takezawa et al. ............ 313/501 |
| 2008/0230750 A1 | 9/2008 | Gilles et al. |

FOREIGN PATENT DOCUMENTS

| | | |
|---|---|---|
| EP | 0 993 020 A | 4/2000 |
| EP | 1 710 289 A1 | 10/2006 |
| JP | 2006-282996 A | 10/2006 |
| JP | 2009-510239 A | 3/2009 |
| KR | 10-0204253 B1 | 6/1999 |
| KR | 10-2002-0072868 A | 9/2002 |
| KR | 10-0717936 B1 | 5/2007 |
| KR | 10-0768177 B1 | 10/2007 |
| KR | 10-0803620 B1 | 2/2008 |
| WO | WO 2008/122331 A1 | 10/2008 |

* cited by examiner

*Primary Examiner* — Britt D Hanley
(74) *Attorney, Agent, or Firm* — Birch, Stewart, Kolasch & Birch, LLP

(57) ABSTRACT

Disclosed is a method for manufacturing a fluorescent material. The method includes:
putting the fluorescent material into a first solution, and agitating the fluorescent material and the first solution;
putting a nano fluorescent material having a nano size into the first solution, and agitating the nano fluorescent material having a nano size and the first solution; and
separating supernatant from the first solution including the fluorescent material, and drying the fluorescent material.
Disclosed is a light emitting device. The light emitting device includes:
a body;
a light emitting element mounted on a cavity formed in the body;
a resin formed in the cavity; and
a fluorescent material added to the resin,
wherein a nano fluorescent material having a nano size is adsorbed in the fluorescent material.

8 Claims, 4 Drawing Sheets

METHOD FOR MANUFACTURING PHOSPHOR AND LIGHT EMITTING DEVICE COMPRISING THE PHOSPHOR

BACKGROUND

1. Field

The present invention relates to a method for manufacturing fluorescent body and a light emitting device including the fluorescent body manufactured by the manufacturing method.

2. Description of the Related Art

A light emitting diode (hereinafter, referred to as LED) can be used to configure a light emitting source by using a compound semiconductor material such as GaAs-based, AlGaAs-based, GaN-based, InGaN-based and InGaAlP-based material.

Said LED is packaged and used as a light emitting device emitting various colors. The light emitting device is now used as a light source for many fields, for example, a lighting indicator, a character indicator and an image viewer which display colors.

SUMMARY

One aspect of this invention is a method for manufacturing a fluorescent material. The method includes:
  putting the fluorescent material into a first solution, and agitating the fluorescent material and the first solution;
  putting a nano fluorescent material having a nano size into the first solution, and agitating the nano fluorescent material having a nano size and the first solution; and
  separating supernatant from the first solution including the fluorescent material, and drying the fluorescent material.

The first solution is at least one selected from the group consisting of DI water, ethanol, acetone, methanol and isopropyl alcohol.

Prior to putting the fluorescent material into the first solution and agitating the fluorescent material and the first solution, the method further includes heating and agitating the first solution until the temperature of the first solution reaches a predetermined temperature.

The putting the fluorescent material into the first solution and agitating the fluorescent material and the first solution includes heating and agitating such that the temperature of the solution does not fall below a predetermined temperature.

Another aspect of this invention is a light emitting device. The light emitting device includes:
  a body;
  a light emitting element mounted on a cavity formed in the body;
  a resin formed in the cavity; and
  a fluorescent material added to the resin,
    wherein a nano fluorescent material having a nano size is adsorbed in the fluorescent material.

DETAILED DESCRIPTION OF EMBODIMENTS

Hereinafter, an embodiment of the present invention will be described in detail with reference to the accompanying drawings. Items disclosed in the embodiment determine the sprit and scope of the present invention. The spirit of the embodiment includes changes and modification of the embodiment by means of addition, elimination and change of the components of the present invention.

Figure 1:
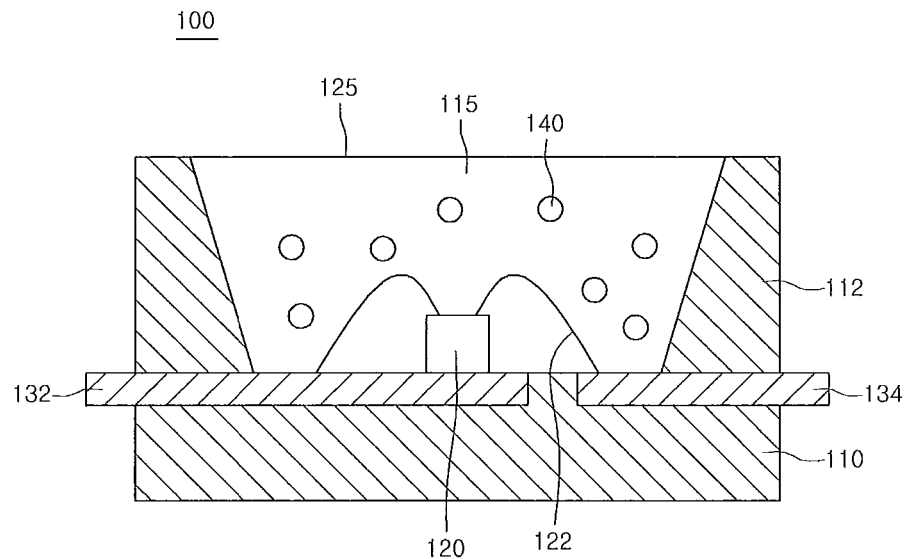
FIG. 1 is a view showing a light emitting device of the present invention.

FIG. 1 is a view showing a light emitting device of the present invention.

Referring to FIG. 1, a light emitting device 100 includes a package body 110, a light emitting element 120, a resin 125 and lead frames 132 and 134.

The package body (110) is injected-molded in a predetermined shape by using at least one selected from the group consisting of PPA (Polyphthalamide), LCP (Liquid Crystal Polymer) and SPS(Syndiotactic polystyrene). A cavity 115 is formed having a constant depth in the upper part 112 of the package body 110. The circumference of the cavity 115 may be formed inclined at a predetermined angle with respect to an axis perpendicular to the bottom surface of the cavity 115.

A plurality of the lead frames 132 and 134 are horizontally formed in the package body 110. The cavity having a shape of a reflective cup is formed on the upper part of the package body 110.

The plurality of the lead frames 132 and 134 are exposed inside the cavity 115 and are electrically disconnected. Both ends of the plurality of the lead frames 132 and 134 are exposed to the outside of the package body 110 and are used as an electrode. A reflective material may be coated on the surfaces of the lead frames 132 and 134.

The light emitting element 120 is die-bonded to a first lead frame 132 among the plurality of the lead frames 132 and 134. The light emitting element 120 is connected to the first lead frame 132 and a second lead frame 134 by means of a wire 122.

The light emitting element 120 may correspond to at least one of colored light emitting diodes, for example, at least one selected from the group consisting of a red light emitting diode, a green light emitting diode, a blue light emitting diode and ultraviolet (UV) light emitting diode.

The resin 125 is formed in the area of the cavity 115. The resin 125 includes a transparent silicon material or epoxy material. Fluorescent material 140 is added to the resin 125. The fluorescent material 140 may correspond to a silicate based fluorescent material. Particularly, nano-sized fluorescent materials are formed on a part of the surface of the fluorescent material 140.

A convex lens may be formed on the resin 125. A protective device such as a zener diode for protecting the light emitting element 120 may be mounted on the plurality of the lead frames 132 and 134.

Figure 2:
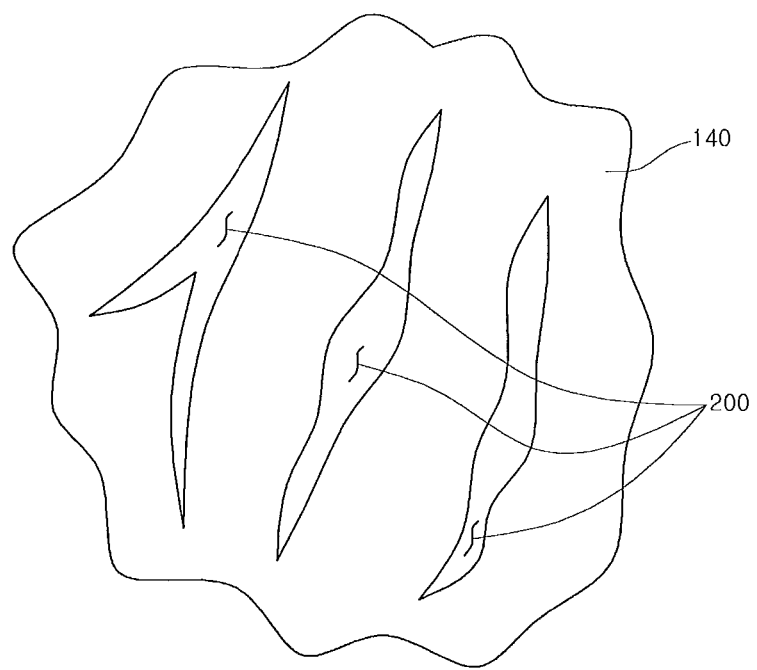
FIG. 2 is a view showing that a crack is created on the surface of a fluorescent material.

The fluorescent material 140 added to the resin 125 may include many cracks 200 formed on the surface of the fluorescent material 140 (see FIG. 2). In a conventional method for manufacturing the fluorescent material, a plurality of the cracks having a shape depressed by a predetermined depth may be formed on the surface of the fluorescent material. When the fluorescent material having such cracks formed therein is added as it is to the resin 125, light emitted from the light emitting element 120 is irregularly scattered through the cracks, which deteriorates optical characteristics.

Figure 3:
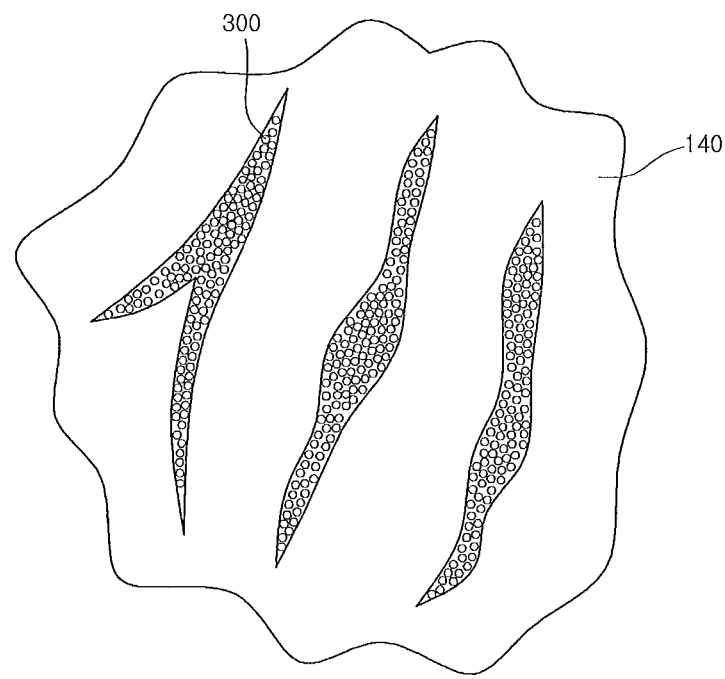
FIG. 3 is a view showing that nano-fluorescent material is adsorbed in the crack on the surface of the fluorescent material in accordance with an embodiment of the present invention.

The nano-sized fluorescent material is added to the fluorescent material in which the crack is formed such that the crack is filled with the nano-sized fluorescent material, i.e., nano-sized fluorescent powder (hereinafter, briefly referred to as a nano fluorescent material). That is, as shown in FIG. 3, the cracks formed on the surface of the fluorescent material 140 are coated with or filled with sphere-shaped nano fluorescent material 300, so that it is possible to reduce the optical scattering caused by the cracks. The nano fluorescent material 300 may be formed by using a thermo spray decomposition method.

The nano fluorescent material 300 having the same color and quality may be used as nano particles for smoothly filling the irregular structure of the fluorescent material 140. The nano fluorescent material 300 may include silicon based fluorescent material which is the same as fluorescer, for example, SrBaSiO:Eu. When nano fluorescent material 300 which are formed of the same material and in the same manner are used, the nano fluorescent material 300 and the fluorescent material 140 are attached to each other by van der vals force. As a result, luminous efficiency may be improved by as much as 20% to 30%.

Hereinafter, in accordance with the embodiment of the present invention, the sphere-shaped nano fluorescent material and a method of coating the nano fluorescent material on the surface (in particular, the crack) of the fluorescent material 140 will be described in detail.

FIGS. 4 to 8 are views describing a method for manufacturing the fluorescent material in accordance with the embodiment of the present invention.

Figure 4:
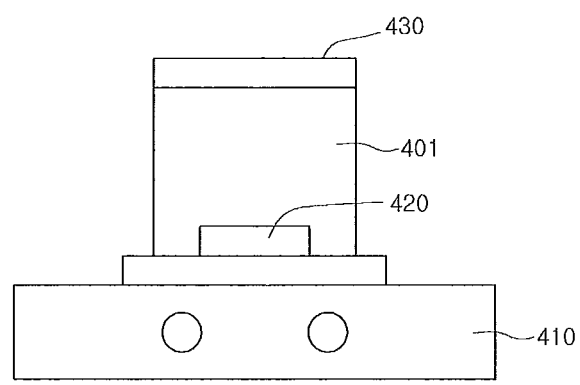
FIGS. 4 to 8 are views describing a method for manufacturing the fluorescent material in accordance with the embodiment of the present invention.

Referring to FIG. 4, provided are an agitator 410 and a beaker 430 being placed on the agitator and receiving solution. DI water solution 401 is put into the beaker 430 and a magnetic bar 420 is put into the beaker 430. Then, the agitator 410 is turned on.

The magnetic bar 420 may not be fixed by a constituent such as an axis of rotation. The agitator 410 rotating the magnetic bar 420 does not contact with the magnetic bar 420 and is able to function as a magnetic agitator which rotates the magnetic bar 420 by applying a magnetic force from the outside. Here, the magnetic agitator generates a rotating magnetic force by using a rotating electromagnet. When the generated magnetic force is applied outwardly, a magnetic body (magnetic bar) external from the agitator is able to rotate by receiving the applied magnetic force.

After the DI water 401 and the magnetic bar 420 are put into the beaker 430, the agitator 410 is operated. Here, the DI water 401 and the magnetic bar 420 are heated and agitated until the temperature of the DI water 401 reaches a predetermined temperature. The predetermined temperature is required to be about 50 degrees Celsius. In this case, ethanol, acetone, methanol and isopropyl alcohol and the like can be used instead of the DI water 401. Moreover, more various solutions can be used according to embodiments.

Figure 5:
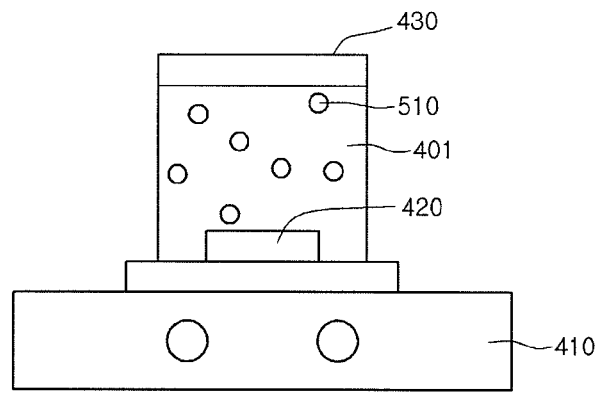

Next, as shown in FIG. 5, 100 gram of a fluorescent material 510 is put into the DI water 401 and is additionally agitated for about 30 minutes. Here, it is necessary to heat and agitate the DI water 401 and the fluorescent material 510 in such a manner that the temperature of the DI water 401 does not fall below the predetermined temperature (about 50 degrees Celsius).

The fluorescent material 510 may be composed of a silicate based material and have a mean particle diameter of 15 μm. However, since the size and kind of the fluorescent material can be variously changed according to a fluorescent material to be manufactured, more detailed description thereof will be omitted. The DI water 401 and the fluorescent material 510 are mixed in the beaker 430.

Figure 6:
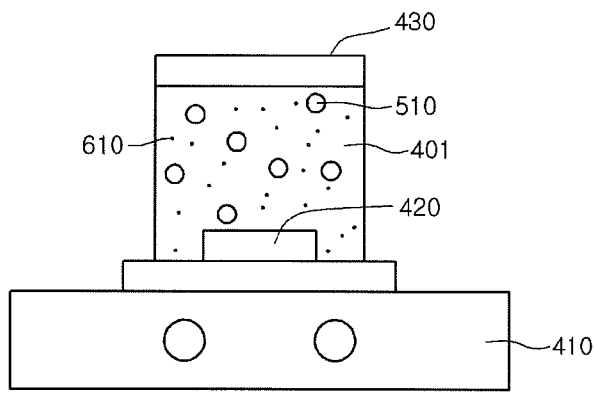

As shown in FIG. 6, a nano fluorescent material 610 is put into the beaker 430 and agitated. The nano fluorescent material 610 is composed of a fluorescent material having a size of from 100 nm to 400 nm Through a thermo spray decomposition process, the nano fluorescent material having a nano size may be formed. If the size of the nano fluorescent material 610 is less than 100 nm, luminance may be deteriorated. In particular, the nano fluorescent material 610 is composed of a fluorescent material having the same color as that of the foregoing fluorescent material 510. For example, when the fluorescent material 510 is a yellow silicate fluorescent material, the nano fluorescent material 610 is also formed of the yellow silicate fluorescent material. This intends that light having the same color is emitted through the resin to which the fluorescent material 510 is added, because the nano fluorescent material 610 is coated on the surface of the fluorescent material 510.

According to the embodiment, 10 gram of the nano fluorescent material 610 is put into the beaker 430. Here, not only the nano-sized powder the nano fluorescent material 610 is slowly put so as not to be blown off, but also a predetermined amount of acetic acid is put into the beaker 430. For example, 1 ml of the acetic acid together with the nano fluorescent material 610 are put into the beaker 430. The temperature of the solution in the beaker 430 should not be equal to or less than a predetermined temperature, preferably, about 50 degrees Celsius. The agitation is performed for about one hour. A person performing the embodiment checks the fluorescent material distribution, while checking the beaker 430.

Here, the reason why the acetic acid is put is that the nano fluorescent material 610 is well adsorbed into the cracks by etching the rough surface of the fluorescent material 510.

Any solution capable of etching the surface of the fluorescent material 510, as well as the acetic acid can be variously used according to embodiments.

Figure 7:
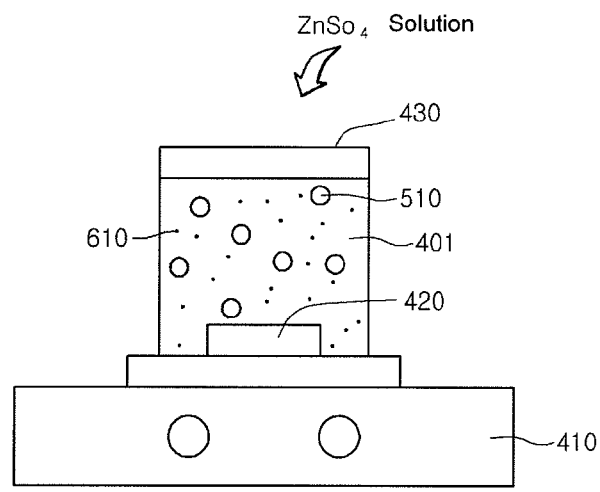

As shown in FIG. 7, a heater of the agitator 410 is turned off and the temperature of the solution of the beaker 430 is reduced. When the temperature of the solution of the beaker 430 reaches about 20 degrees Celsius, $ZnSO_4$ solution of 10% is put into the beaker 430 and more agitation is performed for about one hour. Here, the reason why $ZnSO_4$ solution is put is that electrostatic force between particles of the solution is increased by ionizing the solution in the beaker 430, so that the nano fluorescent material 610 is better adsorbed on the surface of the fluorescent material 510.

After a predetermined time (about one hour) elapses, the agitator 410 is stopped and distribution state of the solution is checked. In other words, supernatant on the fluorescent material is checked whether it becomes transparent or not.

Figure 8:
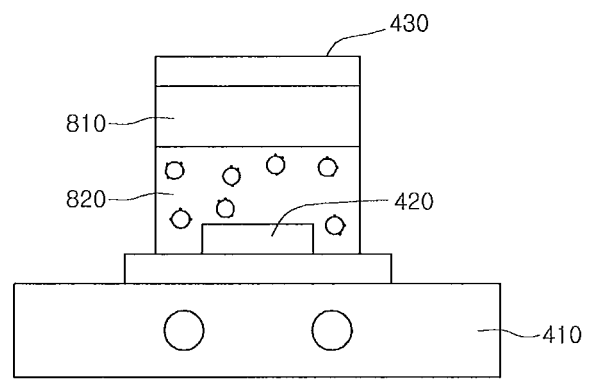

As shown in FIG. 8, the supernatant 810 is checked whether it becomes transparent or not and the agitation time may be increased or decreased according to the transparency of the supernatant 810. If the supernatant 810 becomes transparent (the transparency at this time can be variously determined according to embodiments or a person performing the embodiment), this means that the nano fluorescent material 610 is well adsorbed on the surface of the fluorescent material 510. Accordingly, the supernatant 810 is separated from a solution 820 including the fluorescent material. Here, it is possible to separate the supernatant 810 from the solution 820 including the fluorescent material by using a rotary pump. After the separation, the solution 820 including the fluorescent material is dried.

As a result, the manufacture of the fluorescent material 510 in which the nano fluorescent material 610 is adsorbed is completed. The manufactured fluorescent material 510 corresponds to the fluorescent material 140 shown in FIG. 1. Light emitted from the light emitting element 120 passes through a fluorescent material having a much reduced roughness of its surface, thereby reducing luminous efficiency degradation caused by light scatter.

What is claimed is:

1. A method for manufacturing a silicate based fluorescent material, the method comprising:
    putting the silicate based fluorescent material into a first solution, and agitating the silicate based fluorescent material and the first solution;
    putting a nano fluorescent material having a nano size and acetic acid into the first solution, and agitating the nano fluorescent material having the nano size, the acetic acid and the first solution;
    attaching the nano fluorescent material to a surface of the silicate based fluorescent material; and
    separating a supernatant from the first solution including the silicate based fluorescent material, and drying the silicate based fluorescent material,
    wherein the nano fluorescent material comprises the same material as that of the fluorescent material.

2. The method of claim 1, wherein the first solution is at least one selected from the group consisting of de-ionized (DI) water, ethanol, acetone, methanol and isopropyl alcohol.

3. The method of claim 1, further comprising, prior to putting the silicate based fluorescent material into the first solution and agitating the silicate based fluorescent material and the first solution, heating and agitating the first solution until the temperature of the first solution reaches a predetermined temperature.

4. The method of claim 1, wherein the putting the silicate based fluorescent material into the first solution and agitating the silicate based fluorescent material and the first solution comprises heating and agitating the first solution such that the temperature of the first solution does not fall below a predetermined temperature.

5. The method of claim 4, wherein the predetermined temperature is 50 degrees Celsius.

6. The method of claim 1, wherein the nano fluorescent material is manufactured through a thermo spray decomposition method.

7. The method of claim 1, wherein, after the putting the nano fluorescent material and the acetic acid, the first solution is heated and agitated such that the temperature of the first solution does not fall below a predetermined temperature.

8. The method of claim 1, wherein, after the putting the nano fluorescent material having the nano size into the first solution, and agitating the nano fluorescent material having the nano size and the first solution, additional $ZnSO_4$ solution is put into the first solution and agitated.

* * * * *